(12) United States Patent
Lee

(10) Patent No.: US 7,091,577 B2
(45) Date of Patent: Aug. 15, 2006

(54) VOLTAGE-DIVIDING RESISTOR AND SEMICONDUCTOR DEVICE HAVING THE SAME

(75) Inventor: Suk Kyun Lee, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/319,593

(22) Filed: Dec. 29, 2005

(65) Prior Publication Data

US 2006/0145297 A1   Jul. 6, 2006

(30) Foreign Application Priority Data

Dec. 30, 2004   (KR) .................. 10-2004-0117436

(51) Int. Cl.
*H01L 29/00* (2006.01)

(52) U.S. Cl. ............... 257/538; 257/499; 257/528; 257/536; 257/537; 257/E27.009

(58) Field of Classification Search ............... None
See application file for complete search history.

(56) References Cited

U.S. PATENT DOCUMENTS 6,031,275 A * 2/2000 Kalnitsky et al.
6,703,680 B1 * 3/2004 Toyoshima

* cited by examiner

*Primary Examiner*—Nathan J. Flynn
*Assistant Examiner*—Kevin Quinto
(74) *Attorney, Agent, or Firm*—McKenna Long & Aldridge LLP

(57) ABSTRACT

A voltage-dividing resistor enables a multi-step voltage division. The voltage-dividing resistor includes a polysilicon layer formed on a semiconductor substrate; a metal layer formed on a partial area of the polysilicon layer; an insulating interlayer covering the polysilicon layer and the metal layer; a first electrode for applying a first reference voltage to one end of the polysilicon layer; a second electrode for applying a second reference voltage to the other end of the polysilicon layer; a plurality of third electrodes provided between the first and second electrodes to contact the metal layer; and a plurality of fourth electrodes provided between the first and second electrodes to contact the polysilicon layer.

13 Claims, 2 Drawing Sheets

VOLTAGE-DIVIDING RESISTOR AND SEMICONDUCTOR DEVICE HAVING THE SAME

CROSS REFERENCE TO RELATED APPLICATION

This application claims the benefit of Korean Patent Application No. 10-2004-0117436, filed on Dec. 30, 2004, which is hereby incorporated by reference for all purposes as if fully set forth herein.

BACKGROUND OF THE INVENTION

1. Field of the Invention

The present invention relates to a voltage-dividing resistor in a semiconductor device. Although the present invention is suitable for a wide scope of applications, it is particularly suitable for implementing voltage drops of various sizes using a plurality of resistors of differing size.

2. Discussion of the Related Art

Referring to FIG. 1, a voltage-dividing resistor according to a related art consists of a semiconductor substrate 100, an oxide layer 110 formed on the semiconductor substrate 100, a polysilicon layer 140 formed on the oxide layer 110 to have internal resistance, an insulating layer 130 covering the polysilicon layer 140, an electrode 160 receiving a first reference voltage, an electrode 170 receiving a second reference voltage, and a plurality of electrodes 181, 183, 185, and 187.

The first reference voltage, e.g., a ground potential, is applied to the electrode 160. The second reference voltage, e.g., a voltage level Vdd, is applied to the electrode 170. Hence, the ground potential is applied to one end of the polysilicon layer 140 contacting the electrode 160 via a contact hole, and the voltage level Vdd is applied to the other end of the polysilicon layer 140 contacting the electrode 170 via a contact hole. A voltage drop amounting to the voltage level Vdd is generated by the internal resistance of the polysilicon. Moreover, a tungsten silicide layer 150 can be formed on the polysilicon layer 140 contacting the electrodes 160 and 170 via the respective contact holes to reduce contact resistance.

The electrodes 181, 183, 185, and 187 are arranged between the electrodes 160 and 170 to leave an equal distance d between adjacent electrodes, to thereby divide the voltage level Vdd for each equal distance by a correspondingly equal division of the inner resistance of the polysilicon layer 140. In particular, the electrode 181 outputs a voltage of 1/5 Vdd, the electrode 183 outputs a voltage of 2/5 Vdd, the electrode 185 outputs a voltage of 3/5 Vdd, and the electrode 187 outputs a voltage of 4/5 Vdd.

In the above-configured voltage-dividing resistor, as the electrodes 181, 183, 185, and 187 are arranged equidistantly, the internal resistance of the polysilicon layer is equally divided with the equal distance, so that a voltage drop of the corresponding value can be realized and implemented in a circuit. Therefore, the related art voltage-dividing resistor enables the voltage drop of predetermined steps only and cannot be adaptively applied.

SUMMARY OF THE INVENTION

Accordingly, the present invention is directed to a voltage-dividing resistor in a semiconductor device that substantially obviates one or more problems due to limitations and disadvantages of the related art.

An advantage of the present invention is that it provides a voltage-dividing resistor, by which multi-step voltage division is enabled.

Additional advantages and features of the invention will be set forth in part in the description which follows, and will become apparent from the description, or can be learned by practice of the invention. These and other advantages of the invention may be realized and attained by the structure particularly pointed out in the written description and claims hereof as well as the appended drawings.

To achieve these and other advantages in accordance with the purpose of the invention, as embodied and broadly described herein, there is provided a voltage-dividing resistor, comprising a polysilicon layer formed on a semiconductor substrate; a metal layer formed on a partial area of the polysilicon layer; an insulating interlayer covering the polysilicon layer and the metal layer; a first electrode for applying a first reference voltage to one end of the polysilicon layer; a second electrode for applying a second reference voltage to the other end of the polysilicon layer; a plurality of third electrodes provided between the first and second electrodes to contact the metal layer; and a plurality of fourth electrodes provided between the first and second electrodes to contact the polysilicon layer.

According to another aspect of the present invention, there is provided a semiconductor device, comprising a polysilicon layer formed on a semiconductor substrate; a first reference electrode, electrically connecting with one end of the polysilicon layer, to apply a first reference voltage to the one end of the polysilicon layer; a second reference, electrode electrically connecting with the other end of the polysilicon layer, to apply a second reference voltage to the other end of the polysilicon layer; a tungsten silicide layer formed on a partial area of the polysilicon layer; at least one first resistance distributing electrodes provided between the first and second reference electrodes to contact the tungsten silicide layer; and at least one second resistance distributing electrodes provided between the first and second reference electrodes to contact the polysilicon layer, wherein the tungsten silicide layer extends from the first reference electrode to a point between the first and second reference electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principle of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 1:
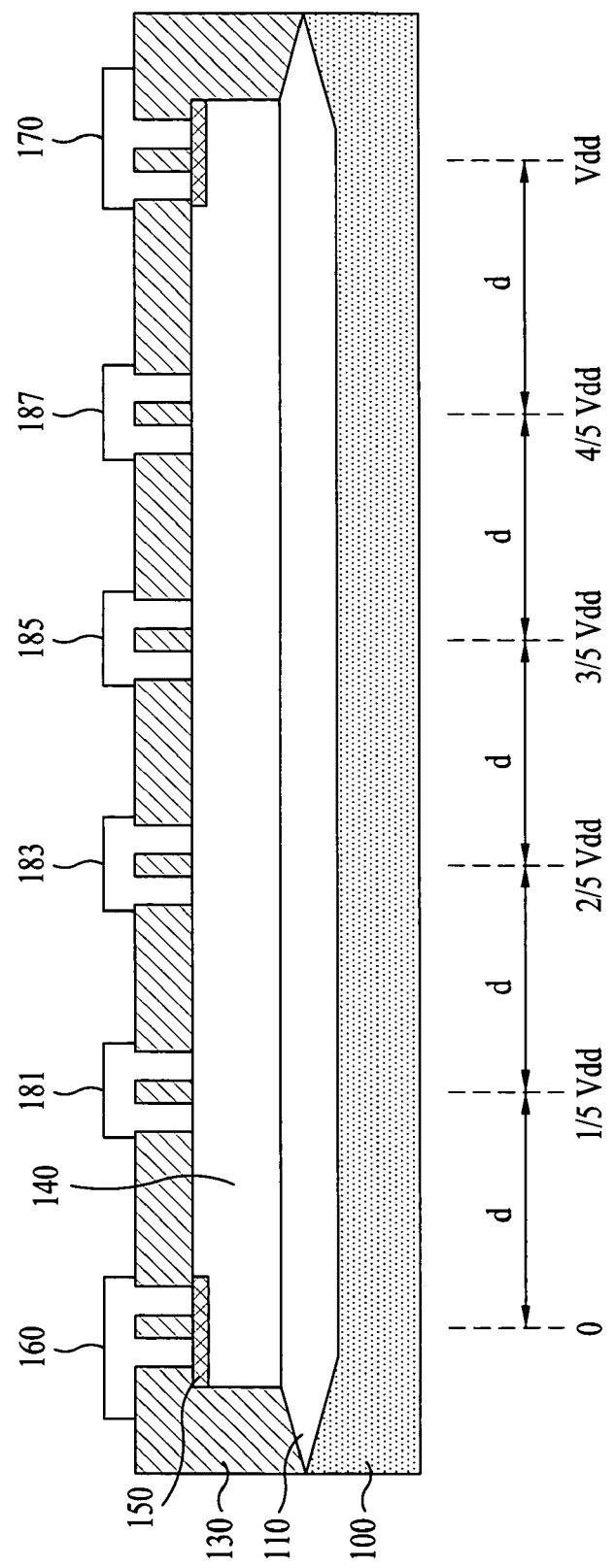
FIG. 1 is a cross-sectional diagram of a voltage-diving resistor according to the related art.
Figure 2:
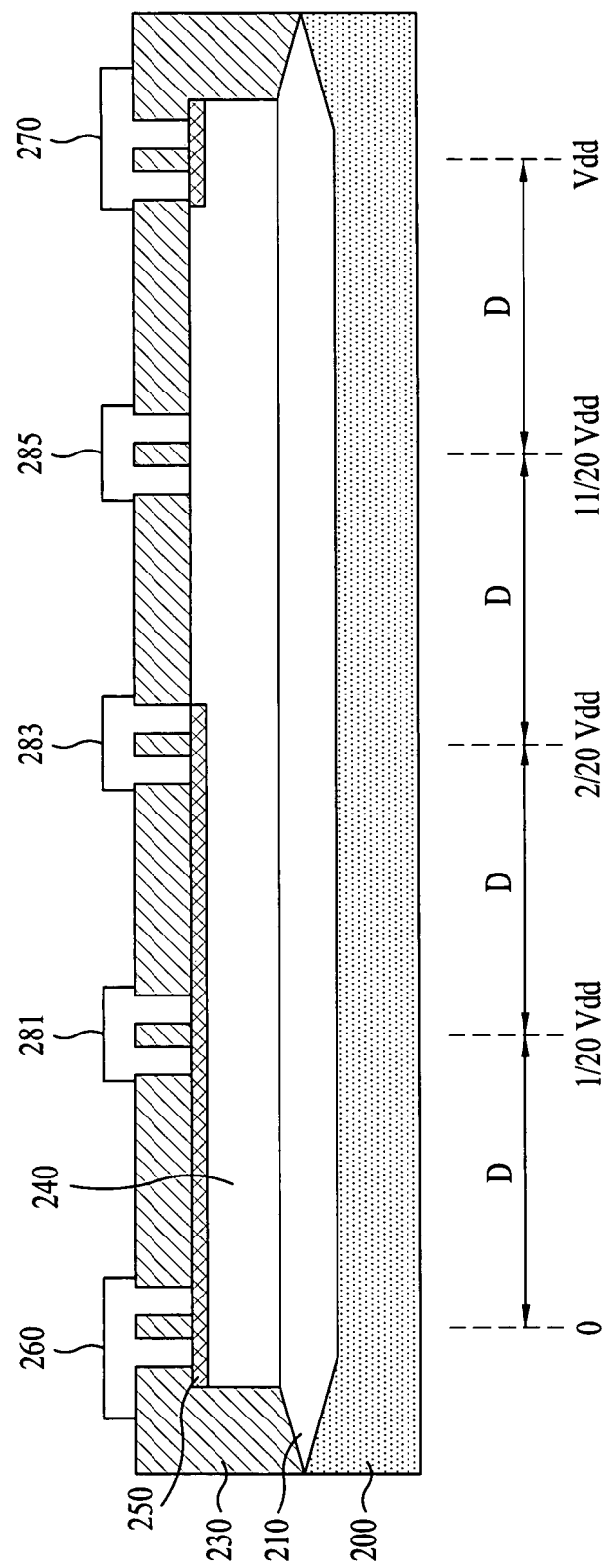
FIG. 2 is a cross-sectional diagram of a voltage-diving resistor according to an exemplary embodiment of the present invention.

Referring to FIG. 2, a voltage-dividing resistor according to the present invention may include a semiconductor substrate 200, an oxide layer 210 formed on the semiconductor substrate 200, a polysilicon layer 240 formed on the oxide layer 210 to have internal resistance, an insulating layer 230 covering the polysilicon layer 240, an electrode 260 receiving a first reference voltage, an electrode 270 receiving a second reference voltage, and a plurality of electrodes 281, 283, and 285.

The first reference voltage, e.g., a ground potential, is applied to the electrode 260. The second reference voltage, e.g., a voltage level Vdd, is applied to the electrode 270. Hence, the ground potential is applied to one end of the polysilicon layer 240 contacting the electrode 260 via a contact hole, and the voltage level Vdd is applied to the other end of the polysilicon layer 240 contacting the electrode 270 via a contact hole. A voltage drop amounting to the voltage level Vdd is generated by the internal resistance of the polysilicon. Moreover, a tungsten silicide layer 250 is formed on about one half the area of the polysilicon layer 240 to reduce contact resistance.

The electrodes 281, 283, and 285 contact with the polysilicon layer 250 and the tungsten silicide layer 250 via contact holes. In particular, the electrodes 281 and 283 make contact with (electrically connect with) the tungsten silicide layer 250 formed on the polysilicon layer 250, while the electrode 285 is in contact with the polysilicon layer 250. The electrode 283 is centrally provided between the electrodes 260 and 270, the electrode 281 is centrally provided between the electrodes 260 and 283, and the electrode 285 is centrally provided to a center between the electrodes 283 and 270.

A divided resistance between the electrodes 260 and 283 is determined by internal resistance of the tungsten silicide layer 250, while a divided resistance between the electrodes 283 and 270 is determined by the internal resistance of the polysilicon layer-240. Therefore, the divided resistance between the metallic electrode 260 and the electrode 283 can be considerably lower than that between the polysilicon electrode 283 and the electrode 270. Assuming a total resistance of 10 ohms (or ten resistance units) between the electrodes 260 and 270, a divided resistance of one ohm (or one resistance unit) occurs between the electrodes 260 and 283 and a divided resistance of 9 ohms (or none resistance units) occurs between the electrodes 283 and 270. Accordingly, a voltage applied to the electrode 283 becomes 1/20 of the value of the voltage level (Vdd) applied to the electrode 270, i.e., 1/10 Vdd, and a voltage applied to the electrode 281 between the electrodes 260 and 283 becomes one half of 1/10 Vdd, i.e., 1/20 Vdd.

A divided resistance between the electrodes 283 and 270 corresponds to 9/10 resistance units and is divided into halves by the electrode 285 centrally provided between the electrodes 283 and 270. Hence, 9/20 resistance units are distributed between the electrodes 283 and 285, and 9/20 resistance units are distributed between the electrodes 285 and 270. Therefore, a voltage applied to the electrode 285 becomes 11/20 Vdd, resulting from a summing of 9/20 Vdd and the voltage (2/20 Vdd) applied to the electrode 283.

Thus, even if the electrodes 281, 283, and 285 are arranged to leave an equal distance D from each other, the distributed resistance varies. Therefore, the voltages applied to the electrodes become 1/20 Vdd, 2/20 Vdd, and 11/20 Vdd, respectively. Hence, even with the electrodes arranged equidistantly, different voltage divisions can be performed.

According to the present invention, a metal layer is formed on a polysilicon layer to enhance the internal resistance of the polysilicon layer. A partial voltage distribution is carried out on the metal layer, and the remaining voltage division is performed on the polysilicon layer. Hence, the present invention enables multi-step voltage divisions.

It will be apparent to those skilled in the art that various modifications and variations can be made in the present invention without departing from the spirit or scope of the invention. Thus, it is intended that the present invention cover such modifications and variation provided they come within the scope of the appended claims and their equivalents.

What is claimed is:

1. A voltage-dividing resistor, comprising:
 a polysilicon layer formed on a semiconductor substrate;
 a metal layer formed on a partial area of the polysilicon layer;
 an insulating interlayer covering the polysilicon layer and the metal layer;
 a first electrode for applying a first reference voltage to one end of the polysilicon layer;
 a second electrode for applying a second reference voltage to the other end of the polysilicon layer;
 a plurality of third electrodes provided between the first and second electrodes to contact the metal layer; and
 a plurality of fourth electrodes provided between the first and second electrodes to contact the polysilicon layer.

2. The voltage-dividing resistor of claim 1, wherein the metal layer comprises tungsten silicide.

3. The voltage-dividing resistor of claim 1, wherein the metal layer extends from the first electrode to a center point between the first and second electrodes.

4. The voltage-dividing resistor of claim 1, wherein the metal layer is formed on an area where the first and second electrodes contact the polysilicon layer.

5. The voltage-dividing resistor of claim 1, wherein the pluralities of third and fourth electrodes are equidistantly arranged between the first and second electrodes.

6. The voltage-dividing resistor of claim 1, wherein the first reference voltage is applied to the polysilicon layer via a contact hole penetrating the insulating interlayer.

7. The voltage-dividing resistor of claim 1, wherein the second reference voltage is applied to the polysilicon layer via a contact hole penetrating the insulating interlayer.

8. The voltage-dividing resistor of claim 1, wherein the plurality of third electrodes contact the metal layer via respective contact holes.

9. The voltage-dividing resistor of claim 1, wherein the plurality of fourth electrodes contact the polysilicon layer via respective contact holes.

10. A semiconductor device, comprising:
 a polysilicon layer formed on a semiconductor substrate;
 a first reference electrode, electrically connecting with one end of the polysilicon layer, to apply a first reference voltage to the one end of the polysilicon layer;
 a second reference electrode electrically connecting with the other end of the polysilicon layer, to apply a second reference voltage to the other end of the polysilicon layer;

a tungsten silicide layer formed on a partial area of the polysilicon layer;

at least one first resistance distributing electrodes provided between the first and second reference electrodes to contact the tungsten silicide layer; and at least one second resistance distributing electrodes provided between the first and second reference electrodes to contact the polysilicon layer, wherein the tungsten silicide layer extends from the first reference electrode to a point between the first and second reference electrodes.

11. The semiconductor device of claim 10, wherein the at least one first and second resistance distributing electrodes are equidistantly arranged between the first and second reference electrodes.

12. The semiconductor device of claim 11, wherein the at least one first resistance distributing electrodes are centrally provided between the first and second reference electrodes and between the first reference electrode and a point between the first and second reference electrodes.

13. The semiconductor device of claim 12, wherein the at least one second resistance distributing electrodes are centrally provided between the first and second reference electrodes and at the second reference electrode.

* * * * *